United States Patent [19]
Schulz

[11] Patent Number: 5,621,350
[45] Date of Patent: Apr. 15, 1997

[54] CIRCUIT FOR AMPLIFYING A WEAK DIRCET VOLTAGE SIGNAL

[75] Inventor: Winfried Schulz, Berlin, Germany

[73] Assignee: Siemens Aktiengesellschaft, Munich, Germany

[21] Appl. No.: 522,271

[22] PCT Filed: Mar. 9, 1994

[86] PCT No.: PCT/DE94/00261

§ 371 Date: Oct. 23, 1995

§ 102(e) Date: Oct. 23, 1995

[87] PCT Pub. No.: WO94/21033

PCT Pub. Date: Sep. 15, 1994

[30] Foreign Application Priority Data

Mar. 9, 1995 [DE] Germany .................. 43 08 229.7

[51] Int. Cl.$^6$ ..................................................... H03F 1/02
[52] U.S. Cl. ...................... 330/9; 330/51; 324/123 R
[58] Field of Search ................. 330/2, 9, 51, 64; 324/123 C, 123 R, 124

[56] References Cited

U.S. PATENT DOCUMENTS 3,667,041  5/1972  Senour ..................... 324/123 R
4,195,266  3/1980  Bingham ..................... 330/51 X Primary Examiner—Steven Mottola
Attorney, Agent, or Firm—Kenyon & Kenyon

[57] ABSTRACT

A circuit for amplifying a weak direct voltage signal has a direct voltage amplifier that can be periodically switched from the direct voltage signal to a reference signal by a switching member connected to its input terminals. The circuit also has a measurement value processing device connected downstream of the direct voltage amplifiers. In order to obtain an amplified direct voltage signal closely approximating the weak direct voltage signal to be amplified, the switching member is arranged as a periodical shunt between the input terminals of the direct voltage amplifier.

2 Claims, 1 Drawing Sheet

CIRCUIT FOR AMPLIFYING A WEAK DIRCET VOLTAGE SIGNAL

BACKGROUND OF THE INVENTION

The invention concerns a circuit arrangement for amplifying a weak direct voltage signal using a direct voltage amplifier that can be periodically switched through a switching member with a periodical short-circuiter on its input terminals from the direct voltage signal to a reference signal and provides adjustment with a measurement value processor connected downstream of the direct voltage amplifier when a reference signal is applied.

A circuit means of this kind is known from the journal *Review of Scientific Instruments*, 59 (1988), July, No. 7, pp. 1241–1243. In this device, a direct voltage amplifier can be insulated from the voltage to be measured by a short-circuiter on the input side and connected to ground. If the direct voltage amplifier is short-circuited on its input side, its output voltage is dependent only on the offset; an output voltage of the direct voltage amplifier produced in this switching state is stored in an additional circuit unit. If, in a subsequent measuring period, the direct voltage amplifier is again at the direct voltage to be measured, the stored output voltage corresponding to the offset voltage is then subtracted from the output voltage thus obtained.

SUMMARY OF THE INVENTION

Therefore the present invention improves upon the circuit of the aforementioned kind so that the amplified direct voltage approximates, as much as possible, the weak DC voltage signal to be amplified.

In accordance with the present invention, a circuit of the aforementioned kind includes a permanently closed switching element of the switching member that is located at the input terminals of the direct voltage amplifier, in series with the periodical short-circuiter in order to amplify a signal at the output diagonal of a measuring bridge as a direct voltage signal. The common connecting point of the short-circuiter and the permanently closed switching element is connected to both a contact of another switching element of the switching member and to a connecting point of the output diagonal of the bridge. The other contact of the other switching element is connected, on the one hand, to the other switching point of the output diagonal of the bridge and, on the other hand, through an additional switching element, to the input terminal, connected to the short-circuiter, of the direct voltage amplifier.

The main advantage of the circuit according to the present invention is that, even when the direct voltage signal to be amplified is zero, but the potential of such a means generating this direct voltage signal in relation to the ground is different from that of the circuit component that generates the reference signal, no common-mode voltage is applied to the direct voltage amplifier in the case of periodic switching. The temperature-dependence of the zero point is thus avoided.

In addition, the influence of the unavoidable resistances of the individual switching elements of the switching member can be compensated for; preferred switching members include electronic switching members, whose individual switching elements have an internal resistance of 100 to 200 ohms when closed, even if manufactured by HCMOS technology. Without the inventive solution, this internal resistance would result in a non-negligible dependence of the voltage at the short-circuiter on the voltage at the output diagonal of the measuring bridge, unavoidably causing measurement errors. In the circuit according to the present invention, however, the output diagonal of the bridge no longer influences the zero state, and thus no more changes occur in the common mode.

BRIEF DESCRIPTION OF THE DRAWING

To assist in describing the present invention, the FIGURE shows an example of a circuit for amplifying a weak direct voltage signal with a short-circuiter at the input of the direct voltage amplifier in accordance with an embodiment of the present invention.

In the circuit means illustrated, a bridge 20 at a voltage U produces a direct voltage signal to be amplified $U_G$ on an output diagonal formed by circuit points 21 and 22. Output diagonal 21–22 of bridge 20 is connected to input terminals 26 and 27 of a direct voltage amplifier 25 through resistors 23 and 24. Between them there is a switching member 40, which contains a permanently closed switching element 42 between input terminals 26 and 27, in series with a periodical short-circuiter 41. Resistors 43 and 44 symbolize the internal resistances of short-circuiter 41 and permanently closed switching element 42, since the entire switching member is preferably manufactured by HCMOS technology. A connecting point 45 between short-circuiter 41 and permanently closed switching element 42 is connected to a contact 46 of another switching element 47 of switching member 40, as well as to terminal 22 of the output diagonal of bridge 20 via resistance 24. The other contact 48 of the other switching element 47 is, on the one hand, connected to the other circuit point 21 of the output diagonal of bridge 20 via resistance 23 and, on the other hand, to input terminal 26 through an additional switching element 49 of switching member 40. Resistors 50 and 51 designate the equivalent resistors of switching elements 47 and 49.

Figure 1:
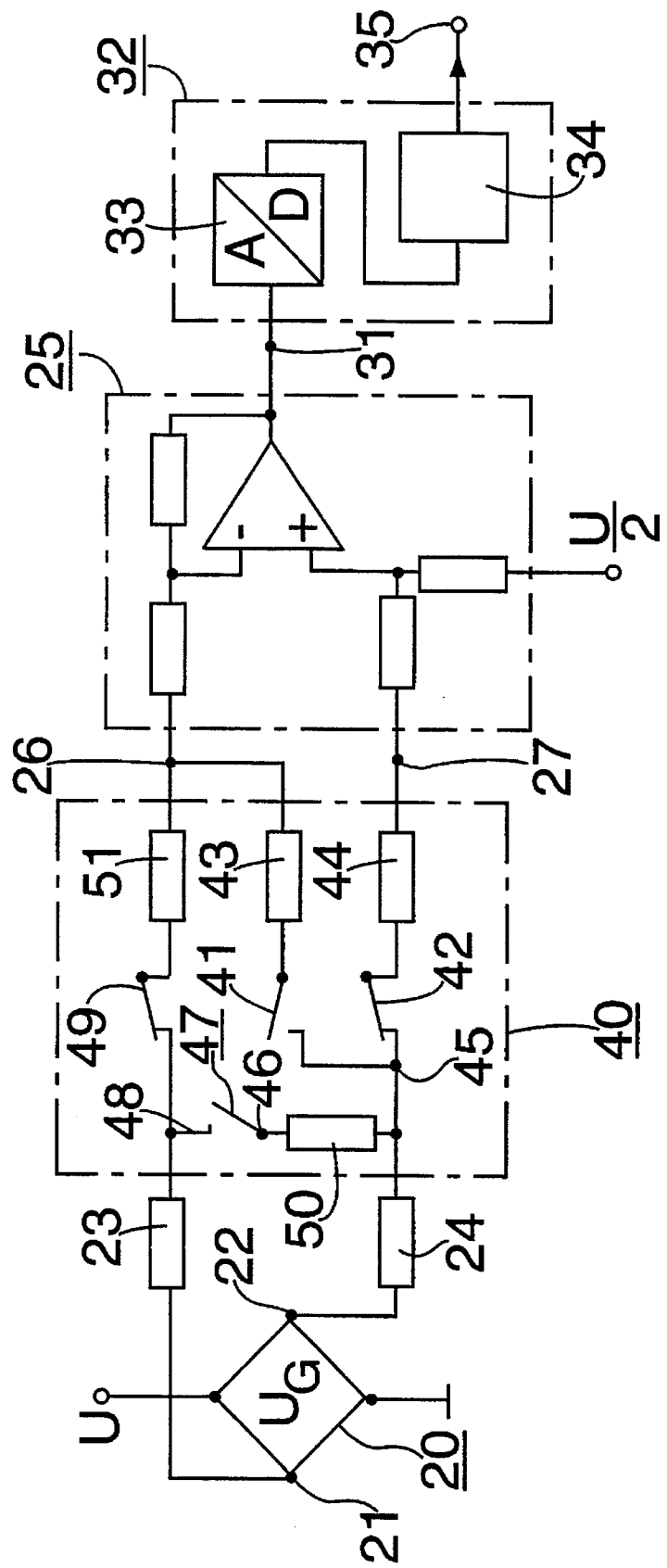

The circuit illustrated operates so that in the measuring mode both additional switching element 49 and permanently closed switching element 42 are closed, while the other switching element 47 and short-circuiter 41 are open. When switching to the zero reference signal (by short-circuiting input terminals 26 and 27), the permanently closed switching element 42, short-circuiter 41 and the other switching element 47 are closed; only additional switching element 49 is open. This operating mode causes the permanently closed switching element 42 with its internal resistance 44 to mirror either the internal resistance of additional switching element 49 or the internal resistance 43 of short-circuiter 41. Thus, in this "zero state" the input of amplifier 25 is insulated from the output diagonal 21–22 of bridge 20 by the additional switching element 49, short-circuited by short-circuiter 41 and set to the potential of the center of bridge 20 by the other switching element 47. Thus the voltage at output diagonal 21–22 no longer influences the zero state, and virtually no more changes occur in the common mode.

The switching member is preferably selected so that it contains the short-circuiter and the three other switching elements in a single housing, which makes the internal resistances of the switching elements vary in the same manner with the ambient temperature; thus the influence of the ambient temperature is compensated for in an optimum manner.

What is claimed is:

1. A circuit for amplifying a weak direct voltage signal from a voltage bridge, the circuit comprising:

a direct voltage amplifier having a plurality of input terminals; and a switching member coupled to said input terminals of said direct voltage amplifier;

wherein said switching member includes
- a periodical short-circuiter coupled to one of said input terminals,
- a permanently closed switching element coupled to said periodical short-circuiter in series between two input terminals of said direct voltage amplifier,
- a first additional switching element, and
- a second additional switching element,
- wherein a common connection point of said short-circuiter and said permanently closed switching element is coupled to a contact of said first additional switching element and is also coupled to a connection point of an output diagonal of the voltage bridge, and
- wherein another contact of said first additional switching element is coupled to another connection point of the output diagonal of the bridge and is also coupled, via said second additional switching element, to said one of said input terminals whereby the direct voltage amplifier may receive, depending on the status of said periodical short circuiter, either a reference signal or the output of the voltage bridge.

2. The circuit of claim 1, further comprising:

an analog-digital converter, connected downstream of the direct voltage amplifier; and a microprocessor connected downstream of the analog-digital converter.

* * * * *